(12) United States Patent
Letz et al.

(10) Patent No.: US 8,841,140 B2
(45) Date of Patent: Sep. 23, 2014

(54) TECHNIQUE FOR FORMING A PASSIVATION LAYER WITHOUT A TERMINAL METAL

(75) Inventors: Tobias Letz, Dresden (DE); Matthias Lehr, Dresden (DE); Joerg Hohage, Dresden (DE); Frank Kuechenmeister, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 1012 days.

(21) Appl. No.: 11/750,567

(22) Filed: May 18, 2007

(65) Prior Publication Data

US 2008/0102540 A1  May 1, 2008

(30) Foreign Application Priority Data

Oct. 31, 2006  (DE) .......................... 10 2006 051 490

(51) Int. Cl.
*C12Q 1/70*  (2006.01)
*H01L 23/00*  (2006.01)
*H01L 23/31*  (2006.01)

(52) U.S. Cl.
CPC ............ *H01L 23/3192* (2013.01); *H01L 24/12* (2013.01); *H01L 2924/01073* (2013.01); *H01L 2224/13099* (2013.01); *H01L 2924/01013* (2013.01); *H01L 2924/01082* (2013.01); *H01L 2924/30105* (2013.01); *H01L 2924/01033* (2013.01); *H01L 24/11* (2013.01); *H01L 2924/04953* (2013.01); *H01L 2924/01005* (2013.01); *H01L 2924/14* (2013.01); *H01L 2924/01022* (2013.01); *H01L 2924/014* (2013.01); *H01L 2924/01068* (2013.01); *H01L 2924/19043* (2013.01); *H01L 2924/01029* (2013.01); *H01L 2924/04941* (2013.01); *H01L 2924/01019* (2013.01); *H01L 2224/1147* (2013.01); *H01L 2924/19041* (2013.01)
USPC .................. 438/5; 257/E23.17; 257/E23.024; 257/E23.169

(58) Field of Classification Search
USPC ............ 438/5, 13; 257/E23.17, 24, 169, 175
See application file for complete search history.

(56) References Cited

U.S. PATENT DOCUMENTS 4,277,881 A * 7/1981 Godejahn, Jr. ................. 438/287
4,374,698 A * 2/1983 Sanders et al. ................. 438/724

(Continued)

FOREIGN PATENT DOCUMENTS

EP       1 065 714 A1    4/2001    ............ H01L 21/768

OTHER PUBLICATIONS

"Xidex Your Patner for Nanodevice Prototyping and Manufacturing". Accessed from http://www.xidex.com/pubs/Xidex_Nanodevice_Prototyping_and_Manufacturing.pdf.*

(Continued)

*Primary Examiner* — Allen Parker
(74) *Attorney, Agent, or Firm* — Williams Morgan, P.C.

(57) ABSTRACT

By determining at least one surface characteristic of a passivation layer stack used for forming a bump structure, the situation after the deposition and patterning of a terminal metal layer stack may be "simulated," thereby providing the potential for using well-established bump manufacturing techniques while nevertheless significantly reducing process complexity by omitting the deposition and patterning of the terminal metal layer stack.

15 Claims, 4 Drawing Sheets

(56) References Cited

U.S. PATENT DOCUMENTS

| | | | | |
|---|---|---|---|---|
| 5,155,059 | A | * | 10/1992 | Hieda .......................... 438/155 |
| 5,175,597 | A | * | 12/1992 | Cachier et al. ................ 257/267 |
| 5,188,704 | A | * | 2/1993 | Babie et al. .................... 216/79 |
| 5,268,072 | A | * | 12/1993 | Agarwala et al. .............. 216/13 |
| 5,807,787 | A | | 9/1998 | Fu et al. ........................ 438/623 |
| 6,107,188 | A | * | 8/2000 | Liu et al. ....................... 438/633 |
| 6,198,155 | B1 | * | 3/2001 | Verhaegh et al. ............. 257/588 |
| 6,249,044 | B1 | * | 6/2001 | Kao et al. ...................... 257/678 |
| 6,316,831 | B1 | * | 11/2001 | Wang ............................. 257/737 |
| 6,348,738 | B1 | | 2/2002 | Dery et al. .................... 257/778 |
| 6,500,750 | B1 | * | 12/2002 | Shroff et al. .................. 438/622 |
| 6,534,396 | B1 | * | 3/2003 | Fahn et al. ..................... 438/632 |
| 6,544,878 | B2 | * | 4/2003 | Wang ............................. 438/612 |
| 6,657,707 | B1 | * | 12/2003 | Morken et al. ................ 356/36 |
| 2002/0000665 | A1 | | 1/2002 | Barr et al. ..................... 257/758 |
| 2003/0183913 | A1 | * | 10/2003 | Robl et al. .................... 257/678 |
| 2005/0014352 | A1 | * | 1/2005 | Torii et al. .................... 438/591 |

OTHER PUBLICATIONS

"Prototype" provided by "Reference for Business" and accessed via http://web.archive.org/web/20060728060643/http://www.referenceforbusiness.com/small/Op-Qu/Prototype.html.*

Listing of terms available on "Enclyclopedia of Small Business" provided on referenceforbusiness.com and accessed via http://web.archive.org/web/20051125043440/http://www.referenceforbusiness.com/small/Op-Qu/index.html.*

"Custom Plush Toys" acessed via http://web.archive.org/web/20000517225253/http://www.customplushtoys.com/step.shtml.*

"Xidex: Your Partner for Nanodevice Prototyping and Manufacturing" published at http://www.xidex.com/pubs/Xidex_Nanodevice_Prototyping_and_Manufacturing.pdf.*

Translation of Official Communication from German Patent Office for German Patent Application No. 10 2006 051 490.4-33 dated Jul. 2, 2007.

* cited by examiner

TECHNIQUE FOR FORMING A PASSIVATION LAYER WITHOUT A TERMINAL METAL

BACKGROUND OF THE INVENTION

1. Field of the Invention

The present disclosure generally relates to the formation of integrated circuits, and, more particularly, to a process flow for forming a passivation layer for receiving bumps connecting the integrated circuit to a package substrate, wherein the passivation layer may comprise silicon dioxide and silicon oxynitride (SiON).

2. Description of the Related Art

In manufacturing integrated circuits, it is usually necessary to package a chip and provide leads and terminals for connecting the chip circuitry with the periphery. In some packaging techniques, chips, chip packages or other appropriate units may be connected by means of solder balls, formed from so-called solder bumps, that are formed on a corresponding layer, which will be referred to herein as a passivation layer, of at least one of the units, for instance on a dielectric layer of the microelectronic chip. In order to connect the microelectronic chip with the corresponding carrier, the surfaces of two respective units to be connected, i.e., the microelectronic chip comprising, for instance, a plurality of integrated circuits and a corresponding package, have formed thereon adequate pad arrangements to electrically connect the two units after reflowing the solder bumps provided on at least one of the units, for instance on the microelectronic chip. In other techniques, solder bumps may have to be formed that are to be connected to corresponding wires, or the solder bumps may be brought into contact with corresponding pad areas of another substrate acting as a heat sink. Consequently, it may be necessary to form a large number of solder bumps that may be distributed over the entire chip area, thereby providing, for example, the I/O capability as well as the desired low-capacitance arrangement required for high frequency applications of modern microelectronic chips that usually include complex circuitry, such as microprocessors, storage circuits and the like, and/or include a plurality of integrated circuits forming a complete complex circuit system.

In modern integrated circuits, highly conductive metals, such as copper and alloys thereof, are used to accommodate the high current densities encountered during the operation of the devices. Consequently, the metallization layers may comprise metal lines and vias formed from copper or copper alloys, wherein the last metallization layer may provide contact areas for connecting to the solder bumps to be formed above the copper-based contact areas. The processing of copper in the subsequent process flow for forming the solder bumps, which is itself a highly complex manufacturing phase, may be performed on the basis of the well-established metal aluminum that has been effectively used for forming solder bump structures in complex aluminum-based microprocessors. For this purpose, the dielectric material of the passivation layer may be deposited and may be patterned prior to or after the deposition of an appropriate barrier and adhesion layer. In some well-established regimes for forming the passivation layer, silicon dioxide followed by silicon oxynitride (SiON) are formed which may be patterned to receive a barrier layer, such as tantalum, and an aluminum layer, which may then also be patterned to provide contact pads at desired locations for forming thereon the solder bumps.

In order to provide hundreds or thousands of mechanically well-fastened solder bumps on corresponding pads, the attachment procedure of the solder bumps requires a careful design, since the entire device may be rendered useless upon failure of only one of the solder bumps. For this reason, one or more carefully chosen layers are generally placed between the solder bumps and the underlying substrate or wafer including the aluminum-covered contact areas. In addition to the important role these interfacial layers, herein also referred to as underbump metallization layers, may play in endowing a sufficient mechanical adhesion of the solder bump to the underlying contact area and the surrounding passivation material, the underbump metallization has to meet further requirements with respect to diffusion characteristics and current conductivity. Regarding the former issue, the underbump metallization layer has to provide an adequate diffusion barrier to prevent the solder material, frequently a mixture of lead (Pb) and tin (Sn), from attacking the chip's underlying metallization layers and thereby destroying or negatively affecting their functionality. Moreover, migration of solder material, such as lead, to other sensitive device areas, for instance into the dielectric, where a radioactive decay in lead may also significantly affect the device performance, has to be effectively suppressed by the underbump metallization. Regarding current conductivity, the underbump metallization, which serves as an interconnect between the solder bump and the underlying metallization layer of the chip, has to exhibit a thickness and a specific resistance that does not inappropriately increase the overall resistance of the metallization pad/solder bump system. In addition, the underbump metallization will serve as a current distribution layer during electroplating of the solder bump material. Electroplating is presently the preferred deposition technique, since physical vapor deposition of solder bump material, which is also used in the art, requires a complex mask technology in order to avoid any misalignments due to thermal expansion of the mask while it is contacted by the hot metal vapors. Moreover, it is extremely difficult to remove the metal mask after completion of the deposition process without damaging the solder pads, particularly when large wafers are processed or the pitch between adjacent solder pads decreases.

Although a mask is also used in the electroplating deposition method, this technique differs from the evaporation method in that the mask is created using photolithography to thereby avoid the above-identified problems caused by physical vapor deposition techniques. After the formation of the solder bumps, the underbump metallization has to be patterned to electrically insulate the individual solder bumps from each other.

The above-described process flow for forming the solder bumps including the complex sequence for forming the underbump metallization layer is significantly affected by the surface properties of the passivation layer resulting from the preceding manufacturing steps for forming and patterning the passivation layer and the aluminum and barrier layers. Consequently, any changes in these process steps may strongly affect the subsequent process flow for providing the solder bumps. On the other hand, the deposition and the patterning of the terminal metal stack, i.e., the barrier layer, such as tantalum, and the aluminum layer, may contribute to the overall production cost and may also represent a cause of increased defect rate and thus reduced production yield, in particular at a manufacturing stage, in which most of the complex process steps have already been completed. Thus, several attempts have been proposed to omit the terminal metal stack and to form the corresponding solder bumps on the basis of the last metal layer of the metallization layer stack in order to reduce process complexity. As is set forth above, however, significant process adaptations in the subsequent process for forming the solder bumps including the underbump metallization layer may be required, thereby possibly contributing to increased process complexity and reduced yield, which may offset the advantages obtained by omitting the terminal metal layer stack.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a technique that enables the formation of a bump structure including a final passivating dielectric material and an underbump metallization layer without using a terminal metal layer, such as an aluminum-based terminal metal layer, while nevertheless well-established process regimes may be used for forming an efficient underbump metallization layer. For this purpose, the effect of a well-established process flow for patterning the terminal metal layer may be taken into consideration when adjusting the surface characteristics of a corresponding passivation layer in order to provide similar surface conditions for depositing a well-established underbump metallization layer stack so as to obtain similar process conditions and process results, for instance with respect to stability, wettability, roughness and the like, even if a respective terminal metal layer may not be used. Consequently, a significant reduction in process complexity and, thus, overall production costs may be achieved in combination with a reduced defect rate and possibly increased electrical performance, while nevertheless well-established process techniques and material compositions may be used for the dielectric material of the bump layer, underbump metallization layer and the subsequently formed bump structure.

According to one illustrative embodiment disclosed herein, a method comprises determining at least one surface characteristic of a passivation layer of a semiconductor device that is formed above a first substrate. The passivation layer is formed on the last metallization layer of the semiconductor device and is used for a patterning process for providing a terminal metal layer. Furthermore, a target value range is determined for the at least one surface characteristic and a passivation layer is formed above the last metallization layer of a semiconductor device that is formed above one or more second substrates without providing a terminal metal layer. A surface characteristic of the passivation layer formed above the one or more second substrates is adjusted by using the target value range.

According to another illustrative embodiment disclosed herein, a method comprises forming a passivation layer on the last metallization layer of a semiconductor device, wherein the passivation layer comprises at least silicon and nitrogen. Furthermore, an amount of nitrogen is reduced in a surface portion of the passivation layer and an underbump metallization layer is subsequently formed above the passivation layer and exposed portions of the last metallization layer.

According to yet another illustrative embodiment disclosed herein, a method comprises forming a passivation layer above the last metallization layer in a semiconductor device and forming a cap layer comprised of silicon dioxide on the passivation layer. Furthermore, the passivation layer and the cap layer are patterned to expose a metal portion of the last metallization layer, and a dielectric material for a bump structure is formed on the cap layer.

BRIEF DESCRIPTION OF THE DRAWINGS

The disclosure may be understood by reference to the following description taken in conjunction with the accompanying drawings, in which like reference numerals identify like elements, and in which.

Figure 1A:
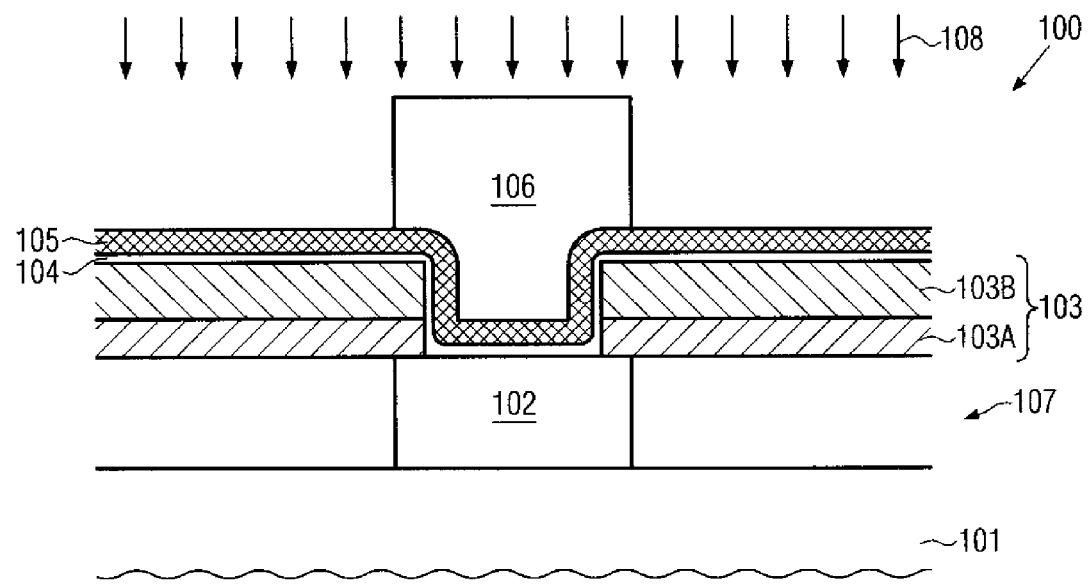
FIGS. 1a-1b schematically illustrate cross-sectional views of a semiconductor device during the formation of a terminal metal layer stack based on aluminum in accordance with a well-established process regime, wherein respective surface characteristics of exposed surface portions of the passivation layer may be examined in order to identify an appropriate target value range used for a process sequence without using a terminal metal layer stack according to illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein contemplates a technique for forming a passivation layer having appropriately designed surface characteristics to provide a high degree of compatibility with well-established process sequences for forming a dielectric material and an underbump metallization layer, followed by an appropriate bump structure, while actually avoiding the formation of a respective terminal metal layer stack. By providing a technology approach on the basis of omitting a terminal metal layer stack, including the deposition of respective barrier layers and metal materials, such as aluminum, and the patterning thereof, a significant reduction of process complexity and production costs may be accomplished while the probability for yield reduction may be reduced. For this purpose, a high degree of compatibility and, thus, reliability of a respective bump metallization process flow may be obtained by providing similar process conditions during the process for forming the underbump metallization layer and the dielectrics related thereto compared to well-established process sequences using a terminal metal layer stack, while nevertheless actually avoiding the deposition and patterning of the corresponding terminal metal layer stack. To this end, at least one relevant surface characteristic of the passivation layer, after the deposition and/or patterning of a terminal metal layer stack, may be identified in order to provide a corresponding criterion for adjusting the surface of a passivation layer prior to the deposition of the dielectrics of the underbump metallization layer on the corresponding metal materials based on the desired well-established process sequence. In this way, a high degree of similarity between the respective surface characteristics of a passivation layer having experienced the corresponding deposition and patterning of the respective terminal metal layer stack and a passivation layer having the correspondingly adjusted surface characteristics may be achieved so that the subsequent process steps for forming the bump metallization layer may be performed under substantially similar conditions, thereby ensuring a high degree of reliability of the respective process results. Consequently, at least one surface characteristic, such as roughness, or, in one illustrative embodiment, the wetting behavior of the respective passivation layer, may be adjusted such that respective process margins may be met, which provide similar or identical process results compared to the well-established process sequence on the basis of a terminal metal layer stack.

Figure 1B:
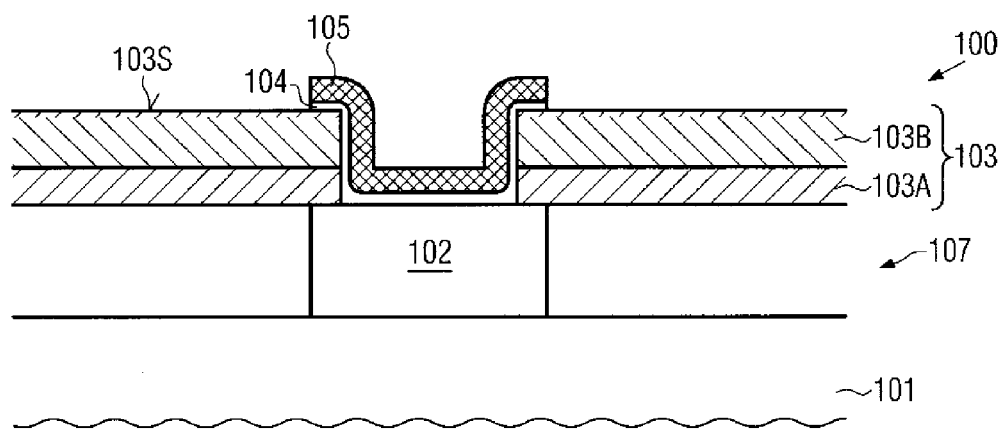

With reference to FIGS. 1a-1b, a typical well-established process flow for forming a passivation layer and a terminal metal layer stack will now be described in more detail in order to illustrate the influence of respective process steps on the surface characteristics of the passivation layer prior to the deposition of the underbump metallization layer, wherein the respective surface characteristics are considered as important aspects in obtaining high process compatibility in combination with reduced production costs and yield losses.

FIG. 1a schematically illustrates a cross-sectional view of a semiconductor device 100 in an advanced manufacturing stage. The semiconductor device 100 comprises a substrate 101, which may have formed therein circuit elements and other microstructural features that are, for convenience, not shown in FIG. 1a. Moreover, the semiconductor device 100 comprises one or more metallization layers including metal lines and vias, which may be formed on the basis of copper, wherein, for convenience, a last metallization layer of the entire stack, indicated as 107, is shown which may comprise a dielectric material, such as a low-k dielectric material or any other appropriate material, and a metal region 102 may be formed in the dielectric material of the layer 107. The metallization layer 107, i.e., the last metallization layer, is covered by a corresponding passivation layer 103, which, according to one well-established process sequence, may be comprised of a first layer 103A and a second layer 103B. For example, in some illustrative process regimes, the first layer 103A may be comprised of silicon nitride, while the second layer 103B may be comprised of silicon oxynitride (SiON). Furthermore, the passivation layer 103 may be patterned so as to expose a portion of the metal region 102, wherein a corresponding barrier/adhesion layer 104 may be formed on the exposed portion of the metal region 102 and on the passivation layer 103. For example, the barrier layer 104 may be comprised of any appropriate barrier material, such as tantalum, tantalum nitride, titanium, titanium nitride, compositions thereof and the like, wherein the barrier/adhesion layer 104 may provide the required diffusion blocking characteristics as well as for the corresponding adhesion between the metal region 102 and an overlying metal layer 105, which may be comprised of aluminum in some well-established techniques. The layers 104 and 105 may form a corresponding metal layer stack, which may be referred to herein as a terminal metal layer stack, since it may be considered as the last metal material connected to the respective last metallization layer 107, i.e., a corresponding exposed portion of the metal region 102 prior to forming a respective bump structure for providing the respective contact structure for connecting to a package carrier as is previously described. Consequently, the term terminal metal layer stack is to be understood as a metal-containing material formed and patterned so as to connect to the last metallization layer 107 of the device 100, thus representing the last contact area thereof. Hence, the terminal metal layer stack is patterned to correspond to the respective region 102 prior to actually forming the bump structure including any underbump metallization layers and dielectrics. It should be appreciated that aluminum is a well-established terminal metal material, since many generations of semiconductor devices have been formed on the basis of aluminum so that a wide class of process techniques has been established over time. Consequently, providing aluminum as a terminal metal layer may provide a well-known interface between advanced metallization layers, such as the layer 107, which may comprise copper possibly in combination with low-k dielectric materials, and bump structures including sophisticated underbump metallization layers.

In this manufacturing stage, a resist mask 106 may be formed on the device 100 to protect a specified contact area substantially defined by the position of the metal region 102, while exposing the remaining layer 105 to an etch ambient 108 that typically includes chlorine-based chemicals for efficiently removing aluminum.

The semiconductor device 100 as shown in FIG. 1*a* may be formed based on the following processes. First, the substrate 101 and any circuit elements contained therein may be manufactured on the basis of well-established process techniques, wherein sophisticated circuit elements having critical dimensions of approximately 50 nm and even less may be formed, followed by the formation of the one or more metallization layers 107, which may include copper-based metal lines and vias, wherein low-k dielectric materials are typically used. Next, the passivation layer stack 103 may be formed on the last metallization layer 107 by any appropriate deposition technique, such as plasma enhanced chemical vapor deposition (PECVD) and the like. The layer 103A may be formed as a silicon nitride layer on the basis of well-established deposition recipes, followed by a deposition of a silicon oxynitride material for forming the layer 103B. During the deposition of the layer 103B, an appropriate ratio of silicon, oxygen and nitrogen may be adjusted by appropriately selecting respective flow rates or other process parameters during the respective deposition process. Since the passivation layer 103 may provide the required integrity of the metallization layer 107 in terms of chemical stability, environmental conditions and the like, as well as in view of further process steps such as forming a respective bump metallization layer thereon, requiring a high degree of adhesion, wettability and the like, respective process parameters for the formation of the passivation layer 103 may be based on process experience and empiric data so as to obtain a high degree of reliability of the finally obtained bump structure.

Next, in one process regime, a standard photolithography process may be performed in order to provide a photoresist mask (not shown) having a shape and dimension that substantially determines the shape and dimension of the proportion of the metal region 102, which may therefore determine, in combination with the material characteristics of the layers 105 and 104, a resistivity of the finally obtained electrical connection between the metallization layer 107, i.e., the metal region 102 and a solder bump to be formed above the region 102. Subsequently, the passivation layer 103 may be opened on the basis of the resist mask and well-established etch techniques, wherein the layer 103B may be etched by using the layer 103A as an etch stop layer, and subsequently the layer 103A may be opened in order to expose a portion of the region 102. After removal of the corresponding resist mask, the barrier/adhesion layer 104 may be deposited, for instance, by sputter deposition, using well-established process recipes, for instance for tantalum or any other appropriate material, which may be used in combination with copper metallization to effectively reduce copper diffusion and enhance adhesion of the overlying aluminum layer 105. The corresponding sputter deposition process may be preceded by an efficient cleaning process for removing any surface contaminations of the exposed portion of the metal region 102. Next, the aluminum layer 105 may be deposited, for instance by sputter deposition, chemical vapor deposition and the like, followed by a standard photolithography process for forming the resist mask 106. Thereafter, the reactive etch ambient 108 may be established, which may require a complex chlorine-based etch chemistry, wherein the process parameters are precisely controlled. The etch process 108 may also comprise a separate etch step for etching through the barrier/adhesion layer 104 and may also include a wet strip process for removing any corrosive etch residuals generated during the complex aluminum etch step. Consequently, the passivation layer 103, i.e., the layer 103B, may be exposed to a plurality of reactive etch ambients, which may affect the final surface characteristics, which have been determined as significantly contributing the process results of further process steps in forming further materials, such as a final dielectric cover material and a corresponding underbump metallization layer.

FIG. 1*b* schematically illustrates the semiconductor device 100 after the above-described process sequence and after removal of the etch mask 106, which may be accomplished on the basis of oxygen-based plasma removal processes. Consequently, the barrier layer 104 and the terminal metal layer 105, for instance comprised of aluminum, may have a size as required for the further processing in forming a respective bump structure. Furthermore, a surface area 103S of the upper layer 103B may have experienced a significant modification with respect to specific material characteristics. In some illustrative embodiments, at least one specific surface characteristic is identified, which may be used for determining a relevant target value range for evaluating the corresponding surface characteristics of a passivation layer to be formed on respective semiconductor devices having similar configurations compared to the device 100, wherein, however, a corresponding metallization regime for forming a bump structure may be used without the deposition and patterning of the terminal metal layer stack defined by the layers 104 and 105. Consequently, by defining a respective surface characteristic, a high degree of similarity may be achieved even though significant process steps, such as the etch process 108 and any preceding or subsequent processes, such as resist removal processes and the like, may not be performed, which may otherwise result in significantly different surface characteristics, thereby having a significant influence on the further process steps, such as the adhesion of respective metal-containing or dielectric materials, as has previously been explained. Consequently, surface characteristics of the surface portion 103S have been examined and, in one illustrative embodiment, in which the passivation layer stack of the layers 103A and 103B is comprised of a silicon nitride material for the layer 103A and a silicon oxynitride for the layer 103B, a significant depletion of nitrogen in the surface area 103S has been identified as an important aspect for obtaining similar process conditions for the subsequent processing, when using well-established manufacturing schemes for forming a bump structure on the basis of well-established process techniques.

Thus, in some illustrative embodiments, the surface portion 103S may have a reduced content of nitrogen, thereby providing a more $SiO_x$ like behavior, which may be required in the subsequent processing for forming additional layers, such as dielectric cover layers, underbump metallization layers and the like. Due to the reduced nitrogen content in the surface portion 103S relative to the remaining portion of the layer 103B and compared to the material characteristics after deposition of the layer 103B, an increased hydrophilic behavior may be obtained, which may significantly affect the following deposition processes in terms of adhesion and process uniformity. In other illustrative embodiments, the surface characteristics of the portion 103S may be examined by determining the respective measurement values for a hydrophobic or hydrophilic behavior, for instance based on contact angle measurements, in which water drops on the surface portion 103S may be used for determining the corresponding measurement values. For example, for a layer configuration of passivation layer 103, i.e., a silicon nitride layer for the layer 103A and a silicon oxynitride layer for the layer 103B, the value for the contact angle may be determined for the material as deposited and a corresponding contact angle may be determined immediately prior to entering the process module for forming the bump structure in order to obtain a meaningful target range for a desired surface condition. For instance, for a specified deposition recipe for the passivation layer 103, which may be a part of a desired overall process flow for forming a bump structure, wherein at least the further process steps after the deposition of the passivation layer 103 may be used, however, without providing the barrier layer 104 and the terminal metal layer 105, measurement values of 38.4±2.5° may be determined for the contact angle for the passivation layer 103 as deposited, thereby indicating a high hydrophobic characteristic of the passivation layer 103. For the specified process flow, after patterning the terminal metal layer 105, including the barrier layer 104, corresponding contact angle values have been determined to be approximately 5-10°, for instance 6.3±0.5° and 8.1±1.7° for different samples, thereby indicating the constant hydrophilic nature of the corresponding surface portion 103S. Consequently, a corresponding target value range may be derived from the above measurement values for the surface portion 103S having not experienced the preceding process steps associated with the deposition and patterning of the terminal metal layer stack 104, 105. For example, for the above-specified process sequence, a target value range for the contact angle of a corresponding silicon oxynitride layer without terminal metal deposition and patterning prior to entering the bump module may be selected to be approximately 7-12°. It should be appreciated, however, that corresponding measurement values may be different for different process flows under consideration and respective appropriate target values may be established on the basis of the corresponding measurement data.

It should also be appreciated that a contact angle may represent a convenient surface characteristic that may be readily determined for a plurality of substrates in order to identify the appropriate target value range. In other cases, other measurement parameters may be used in order to determine a desired value range for a surface characteristic under consideration. For instance, alternatively or additionally to the contact angle, the nitrogen content may be determined, since, as previously explained, for the material composition of the passivation layer 103 described above, a significant depletion of nitrogen may occur, thereby finally resulting in the desired surface characteristics of the portion 103S. Once one or more respective surface characteristics have been identified, which may have a significant influence on the further process steps, a respective recipe for a treatment or other modification of the desired passivation layer material may be determined in order to provide the desired surface characteristics in accordance with the previously established target value range, such as a desired range of contact angles as explained above. In some illustrative embodiments, one or more of the identified surface characteristics may be examined in combination with specific process steps of the process flow for depositing and patterning the layers 104 and 105. To this end, at certain intermediate process stages, the corresponding surface characteristics of the portion 103S may be examined, if possible, and may be correlated to the corresponding previously performed process steps. For instance, the deposition of the barrier layer 104 and a corresponding removal thereof may be separately examined in order to identify the contribution of the corresponding process flow on the final surface characteristics of the portion 103S. Similarly, the patterning process 108 may be performed and the corresponding surface characteristics may be determined prior to a corresponding oxygen-based plasma etch process, which is typically used for removing the resist mask 106 after the patterning of the layers 104, 105. In this way, main contributors to the final surface characteristics of the portion 103S may be identified and may be used for developing a corresponding process strategy for obtaining the desired surface characteristics of the portion 103S without actually performing the overall process sequence as previously described with reference to FIG. 1a. For instance, one or more surface characteristics may be determined, wherein it may not necessarily be assumed that only these surface characteristics may represent the main aspects in obtaining the desired overall surface characteristics of the passivation layer 103. Thereafter, one or more processes may be determined, which may have a significant influence on these surface characteristics.

From the corresponding process steps identified as being a main contributor to a change of surface characteristics, a corresponding process recipe may be established which may be applied to the passivation layer 103 while, nevertheless, the actual deposition and, thus, patterning of the layers 104, 105 may be omitted. In this manner, a respective surface treatment for any type of passivation layer 103 may be accomplished for any desired process flow for forming a passivation layer in combination with a bump structure without a detailed analysis of respective process and surface characteristics having an influence on the surface characteristics of the passivation layer 103. For example, if it is determined that the deposition process for forming the layers 104 and/or 105 may have a significant influence on the finally obtained surface characteristics, a respective surface modification process may be determined, for instance by establishing similar process conditions, however, without actually depositing the barrier material or the metal of the layer 104 and 105, so as to "simulate" the corresponding processes. Similarly, when the patterning processes in the form of plasma etch recipes, wet etch chemistries and the like are identified as substantially determining the surface characteristics, a corresponding surface modification process may be established on the basis of the respective process parameters in order to provide similar process conditions without actually requiring the deposition of the layers 104, 105. In other cases, respective measurement data, such as the above-described contact angle measurement data, the nitrogen content and the like, may be used for identifying respective mechanisms responsible for obtaining the final surface characteristics of the portion 103S. Then, based on the measurement data, a corresponding modification process may be established as will be described later on in more detail.

As a result, based on the passivation layer 103 as shown in FIG. 1b, one or more surface specific characteristics may be determined for the portion 103S which may be established after the deposition of the passivation layer 103 to obtain substantially similar process conditions for the further processing, even though the terminal metal layer stack 104, 105 may actually not be provided for forming respective bump structures in and above the passivation layer 103.

Figure 2A:
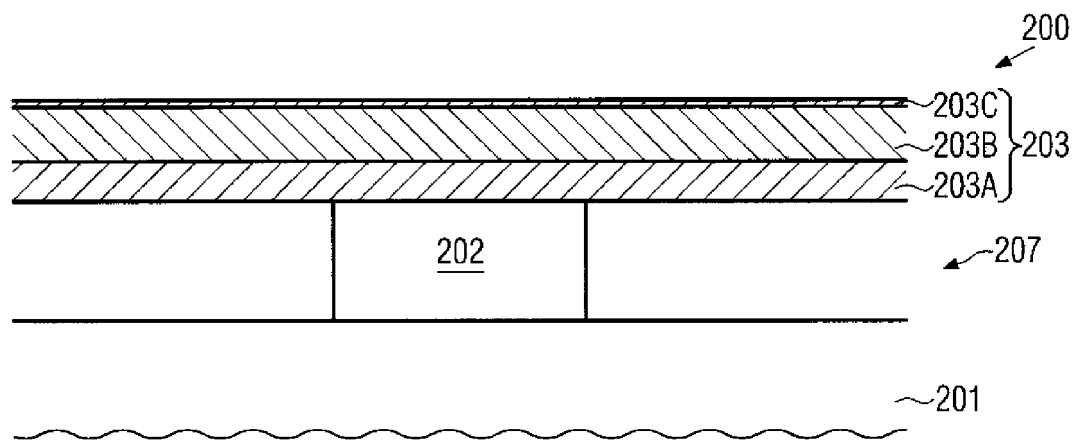
FIGS. 2a-2b schematically illustrate cross-sectional views of a semiconductor device during various manufacturing stages in forming an enhanced passivation layer having a cap layer of well-defined surface characteristics in order to form thereon a bump structure without providing a terminal metal layer stack according to illustrative embodiments.
Figure 2B:
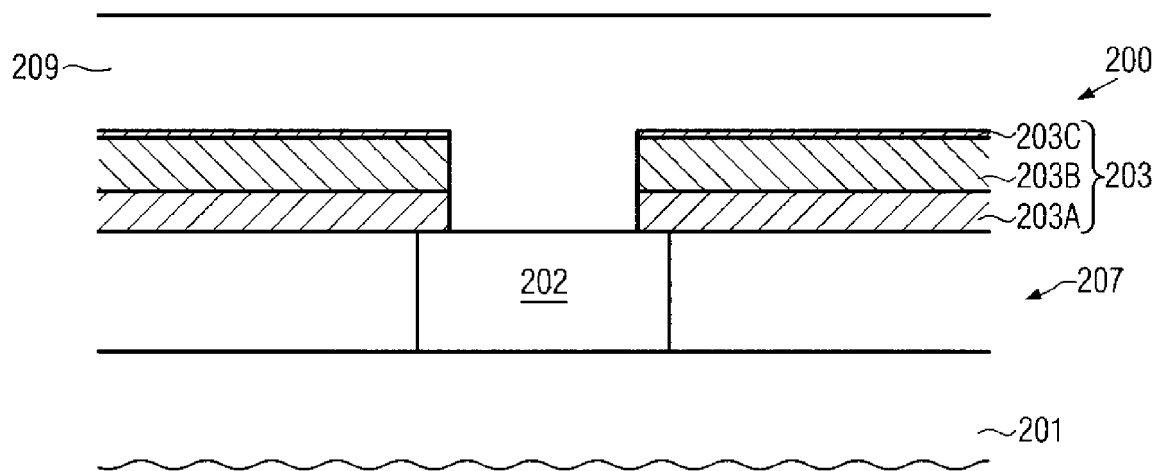

With reference to FIGS. 2a-2b, further illustrative embodiments will now be described, in which a corresponding passivation layer stack may be provided in which the respective surface characteristics are designed in such a manner that a subsequent technology approach may be used, in which a well-established process flow for forming underbump metallization layers and bump structures may be used, as is also used in a corresponding manufacturing regime on the basis of a terminal metal layer stack, wherein, however, a significant reduction of process complexity may be achieved by omitting the corresponding deposition and patterning of the terminal metal layer stack while, nevertheless, similar process results may be obtained with respect to adhesion and reliability of the corresponding bump structure.

FIG. 2a schematically illustrates a semiconductor device 200, which may comprise a substrate 201, above which may be formed a metallization layer 207. With respect to the substrate 201 and the metallization layer 207, the same criteria apply as previously explained with reference to the device 100. Thus, the substrate 201 may comprise a plurality of circuit elements, such as transistors, capacitors and the like, which may be electrically connected on the basis of one or more metallization layers, wherein the layer 207 represents the last metallization layer of the device 200. Hence, a corresponding bump structure may be formed above the last metallization layer 207 in order to provide contact areas to one or more metal regions 202 in the last metallization layer 207 according to a specified circuit layout. As previously explained, the corresponding bump structure is to be formed on the basis of a specified well-established process flow which provides a desired high degree of reliability of the corresponding bump structure, wherein respective process techniques may be used, or, in conventional strategies, are employed in combination with a terminal metal layer stack prior to actually forming the corresponding bump structure including a final passivation material, which may be referred to herein as a dielectric cover layer, in combination with a respective underbump metallization layer that provides the corresponding adhesion, barrier and drive current characteristics, as is previously explained.

The device 200 may comprise a passivation layer 203 which, in illustrative embodiments, may comprise a similar configuration as is shown in FIG. 1*b* for the device 100 in order to provide a high degree of process compatibility and product compatibility between the devices 100 and 200. Thus, in these embodiments, the passivation layer 203 may comprise a first layer 203A, which may represent a silicon nitride layer followed by a second dielectric material 203B which may be provided in the form of a silicon oxynitride material. Additionally, a third layer 203C may be provided, which may substantially "resemble" the characteristics of the surface portion 103S as is previously explained. Hence, the third layer 203C may be provided as a silicon dioxide like material having a material composition and a thickness that is similar to the corresponding characteristics of the surface portion 103S. For example, as previously explained, the nitrogen content of the layer 203C may be adapted according to a previously established target value range in order to obtain similar surface characteristics relative to the surface portion 103S. In other cases, the layer 203C may correspond to other target values, for instance contact angle measurements may result in corresponding values in accordance with a previously established target value range, thereby indicating the desired hydrophilic behavior of the layer 203C. Consequently, desired surface characteristics of the passivation layer 203 are provided for the further processing of the device 200 without the necessity of providing a terminal metal layer stack, so that similar conditions with respect to adhesion, surface roughness, wettability and the like for the deposition and patterning of subsequent material layers may be provided.

In other illustrative embodiments, the passivation layer 203 may comprise other dielectric materials compared to the passivation layer 103, while nevertheless the layer 203C may provide the desired surface characteristics in order to allow the usage of process strategies that nevertheless correspond to a process flow used for the device 100 when actually forming the bump structure in accordance with a corresponding process sequence. That is, different dielectric materials for the layers 203A and 203B may be used in combination with the layer 203C, although, after the formation of the passivation layer 203, the further process steps for forming the bump structure may be used in accordance with a process strategy actually used and developed for the passivation layer 103 having the material layers 103A, 103B. For instance, using well-established dielectric materials, such as silicon nitride and silicon dioxide, the layer 203A may be comprised of silicon dioxide, while the layer 203B may represent a silicon nitride layer. Nevertheless, the layer 203C may represent a silicon dioxide like layer having the desired surface characteristics, thereby providing the desired surface characteristics even though the further process steps may actually be designed for a silicon oxynitride layer 103B as previously described. Hence, a high degree of flexibility may be provided by appropriately adjusting the material characteristics of the layer 203C, since a plurality of material compositions may be used for the layers 203A, 203B, while nevertheless the same process regime may be used for the subsequent process steps.

The semiconductor device 200 as shown in FIG. 2*a* may be formed on the basis of the following processes. After providing the substrate 201 and forming thereon and therein the respective circuit elements, the corresponding one or more metallization layers, including the last metallization layer 207, may be formed in accordance with the desired process sequence. Thereafter, the passivation layer 203 may be formed, wherein conventional process recipes may be used as are also explained for the passivation layer 103 of the device 100, or wherein other process strategies may be used, due to the high degree of flexibility with respect to the materials used for the layers 203A, 203B. In some illustrative embodiments, the layer 203A may be deposited in the form of a silicon nitride layer, as previously explained, followed by the deposition of a silicon oxynitride material to form the layer 203B, wherein, in one illustrative embodiment, at a final stage of the deposition process, respective process parameters may be changed in order to obtain the layer 203C having a required thickness and material composition. That is, in this case, the nitrogen content may be reduced during the final deposition step and the layer 203C may be obtained as a silicon dioxide like layer, wherein the corresponding process parameters may be controlled in accordance with the previously established target value range to maintain the one or more specific surface characteristics, such as the nitrogen content and the like, within the desired process margins. In other illustrative embodiments, the layers 203A, 203B may be formed on the basis of any appropriate deposition technique, including chemical vapor deposition (CVD) processes, spin-on techniques and the like, in order to provide enhanced flexibility in providing any appropriate material, while the layer 203C may be formed on the basis of a correspondingly designed CVD process.

FIG. 2*b* schematically illustrates the semiconductor device 200 in a further advanced manufacturing stage, in which an additional dielectric material 209 may be formed above the passivation layer 203, which may, at this manufacturing stage, include a respective trench or contact area for exposing a portion of the metal region 202. In other illustrative embodiments, the passivation layer 203 may still be non-patterned and, therefore, the corresponding dielectric material, which may be referred to as a dielectric cover layer 209, may be uniformly provided on the passivation layer 203. For example, the cover layer 209 may be comprised of polyimide, which is a frequently used final passivation material for semiconductor devices. The material 209 may be provided by spin-on techniques in combination with appropriate post-deposition processes for curing the initially highly deformable material. In the embodiment shown, prior to the deposition of the cover layer 209, a corresponding photolithography process may have been performed in order to expose a portion of the metal region 202. Such process strategies are well established in the art. As previously explained, irrespective of whether the passivation layer 203 may have been patterned or not, the corresponding surface characteristics provided by the layer 203C may provide similar process conditions for the formation of the layer 209 as are typically also encountered during a process sequence for forming a corresponding cover layer on the basis of a terminal metal layer, as is previously explained with reference to the device 100.

Figure 2C:
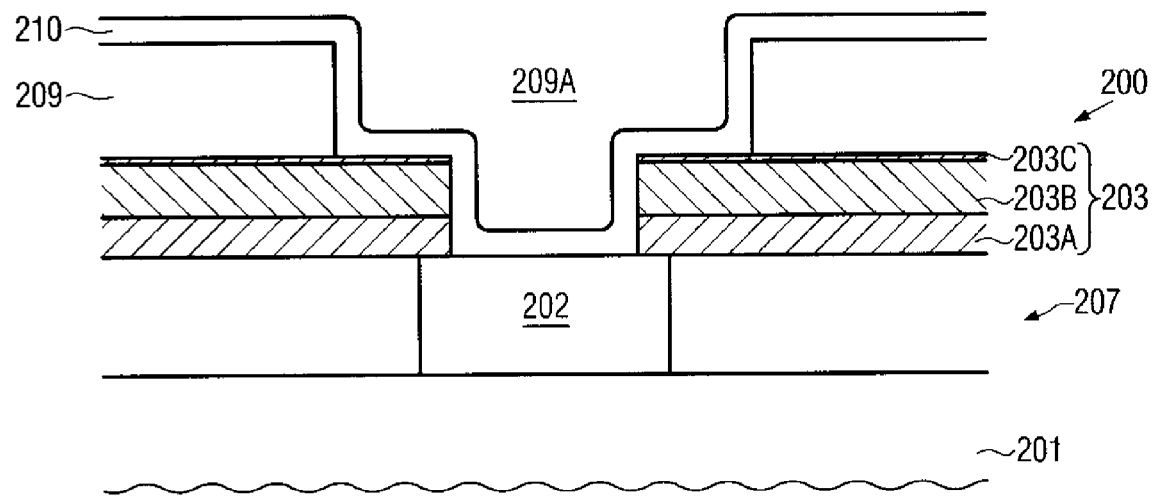
FIG. 2c schematically illustrates a semiconductor device comprising a passivation layer of a different material composition with an appropriate cap layer according to a further illustrative embodiment.

FIG. 2c schematically illustrates the semiconductor device 200 in a further advanced manufacturing stage. Here, the dielectric cover layer 209, which may be comprised of polyimide, may be patterned so as to have an opening 209A, which may substantially correspond to a respective opening for receiving an appropriate material for forming a bump structure, such as a solder material, as is previously explained. Furthermore, in this manufacturing stage, a respective underbump metallization layer 210 may be formed above the cover layer 209 and the opening 209A. As previously explained, the underbump metallization layer 210 may be comprised of two or more sub-layers providing the required characteristics with respect to mechanical, thermal and electrical behavior. Due to the provision of the passivation layer 203, a well-established material composition and deposition recipes for the layer 210 may be used, since the corresponding structure may have similar conditions compared to a corresponding structure that may additionally have a terminal metal layer stack as previously explained. For example, the adhesion of the cover layer 209 to the passivation layer 203 may have substantially the same characteristics and also a contact of the material of the layer 210 with exposed portions of the passivation layer 203 may provide substantially the same characteristics compared to a process regime using a terminal metal layer stack, in which exposed portions of the respective passivation layer, such as the layer 103, may come into contact with the underbump metallization material. Thus, irrespective of the patterning regime for forming the opening 209A, well-established process techniques may be used for forming the underbump metallization layer 210. Thereafter, further processing may be continued by providing an appropriate resist mask for exposing the opening 209A and depositing an appropriate bump material, such as a mixture of tin and lead, or any other mixtures, such as lead-free bump materials, on the basis of well-established deposition regimes, such as electroplating and the like.

As a consequence, the semiconductor device 200 may be formed on the basis of a well-established process technique for forming the dielectric cover layer 209, the underbump metallization layer 210 and a corresponding bump structure while nevertheless significantly reducing the overall production costs due to the omission of complex deposition and patterning processes for a terminal metal layer stack, such as the layers 104 and 105 shown in FIGS. 1a and 1b.

Figure 2D:
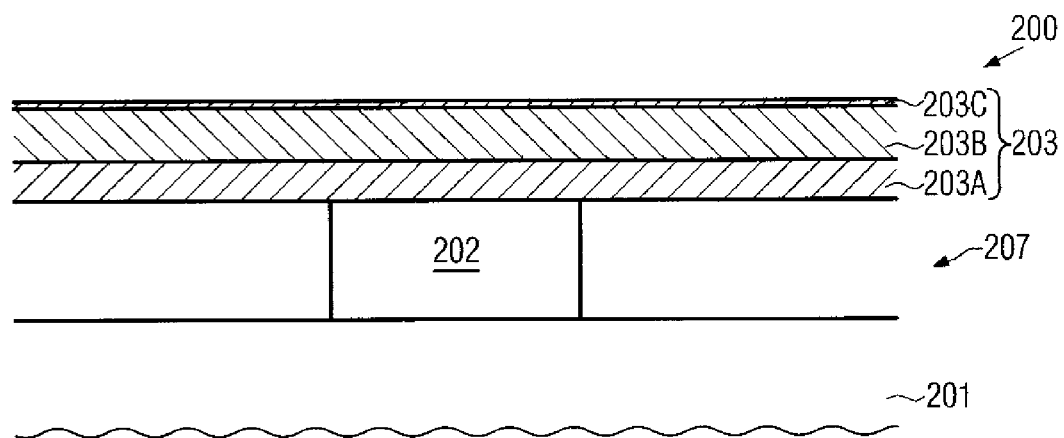
FIG. 2d schematically illustrates a semiconductor device comprising a further passivation layer including a cap layer according to yet another illustrative embodiment.

FIG. 2d schematically illustrates the semiconductor device 200 in accordance with a further illustrative embodiment, in which, as previously shown, a different material composition of the passivation layer 203 may be used, while nevertheless substantially the same surface characteristics may be obtained. In this regime, the layer 203A may be comprised of silicon dioxide while the layer 203B may be comprised of silicon nitride. The layer 203C may be provided in the form of a material providing the desired surface characteristics. For instance, as previously explained, when the corresponding further process flow is based on a silicon dioxide like surface characteristic, the layer 203C may be provided in the form of a silicon dioxide layer, while, in other cases, any other appropriate surface layer may be formed that provides the desired characteristics during the further processing. In one illustrative embodiment, when the layer 203B is comprised of silicon nitride and when a silicon dioxide like layer may be required, the layer 203C may be deposited, as is previously explained, while, in other embodiments, a surface treatment may be performed, for instance on the basis of an oxygen plasma, thereby forming a silicon dioxide like material in the surface portion of the corresponding silicon nitride material, thereby providing the required surface characteristics. For this purpose, a similar plasma ambient may be established, as may also be used for the removal of resist material, which is a well-established process in the art. In other cases, the corresponding plasma treatment for oxidizing the silicon nitride material may be performed as an in situ process with the deposition of the silicon nitride material, thereby providing a highly efficient process sequence, wherein a highly dense silicon dioxide material may be formed on the silicon nitride material.

Figure 2E:
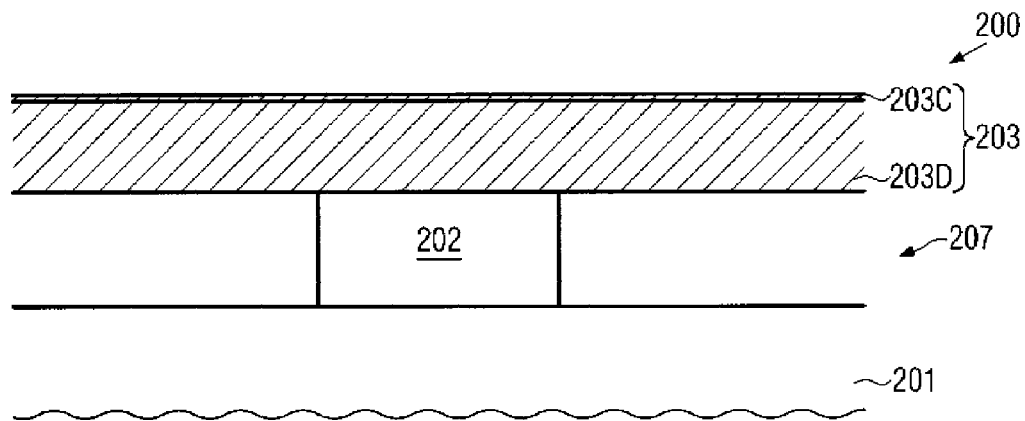
FIGS. 2e-2g schematically illustrate a semiconductor device in a manufacturing stage for forming a passivation layer having a modified surface portion in order to provide high process compatibility with a well-established process sequence for forming a bump structure according to yet other illustrative embodiments disclosed herein.

FIG. 2e schematically illustrates the semiconductor device 200, wherein the passivation layer 203 may comprise the silicon dioxide like cap layer 203C, while a remaining layer 203D of the passivation layer 203 may have any desired material composition as may be advantageous for the further processing, wherein, nevertheless, for forming respective additional material layers, such as the cover layer 209 and the underbump metallization layer 210, appropriate process conditions may be provided due to the surface characteristics of the layer 203C.

Figure 2F:
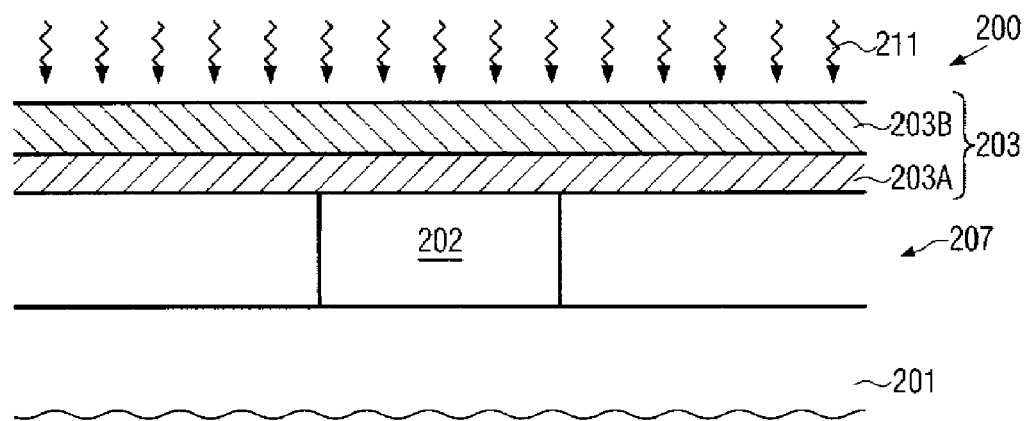

FIG. 2f schematically illustrates the semiconductor device 200 during the formation of the passivation layer 203 according to further illustrative embodiments. In the embodiment shown, the passivation layer 203 may be formed in accordance with well-established recipes, such as, for instance, a process strategy as previously explained with reference to FIG. 1a. Consequently, in one illustrative embodiment, the passivation layer 203 may comprise the layer 203A in the form of a silicon nitride layer followed by a silicon oxynitride material for the layer 203B. Thereafter, a corresponding surface modification process 211 may be performed in order to adjust the surface characteristics of the passivation layer 203 in accordance with process requirements for the subsequent process module. As previously explained, the modification process 211 may be established on the basis of respective measurement data obtained in accordance with process strategies as previously explained with reference to FIG. 1b. For example, in one illustrative embodiment, the modification process 211 may be performed to obtain respective contact angle measurement data indicating the high hydrophobic nature of the layer 203B after the treatment 211. In one illustrative embodiment, the treatment 211 may be performed on the basis of a nitrogen oxide ambient to obtain the desired surface characteristics. For example, the corresponding process parameters, such as plasma power, process pressure, temperature, nitrogen oxide flow rate and the like, may be adjusted in order to obtain the respective contact angle measurement data within a specified target value range. As an example, for the specific process flow described with reference to FIG. 1b, a target value range for the contact angle measurement data may range within 5-12 degrees in order to obtain the desired surface characteristics, wherein the corresponding contact angle represents a corresponding depletion of nitrogen in a surface area of the layer 203B, which has been identified as one important factor contributing to the desired process behavior in the subsequent steps.

In other illustrative embodiments, the modification process 211 may include one or more treatments on the basis of a reactive ambient, the process conditions of which may have been established in accordance with the measurement data and the process analysis as described with reference to FIG.

1b. In still other illustrative embodiments, the surface modification process 211 may comprise at least one reactive process step used in depositing and/or patterning a corresponding terminal metal layer stack according to a specified process flow while actually not depositing and patterning a respective terminal metal layer material. For example, if a specified process flow has been selected for forming a corresponding bump structure, however, without providing the terminal metal layer stack involved in this process flow, the modification process 211 may comprise a reactive ambient as may typically be applied to the passivation layer during the deposition and/or patterning of a corresponding terminal metal layer, wherein the corresponding process parameters may, however, be appropriately adapted to obtain the corresponding surface characteristics within a specified target value range. For instance, if the final phase of the patterning process, as previously described with reference to FIG. 1*a*, has been identified as the main cause for obtaining the desired surface modification, a corresponding reactive ambient may be established during the modification process 211, thereby obtaining a desired degree of surface modification. In other cases, respective reactive ambients may be established, however, with a significantly reduced exposure time, in order to "simulate" the corresponding process conditions during an actual patterning of a terminal metal layer stack. In this way, a high degree of flexibility may be provided without requiring undue process analysis, when different process regimes are to be used for forming a corresponding bump structure.

Figure 2G:
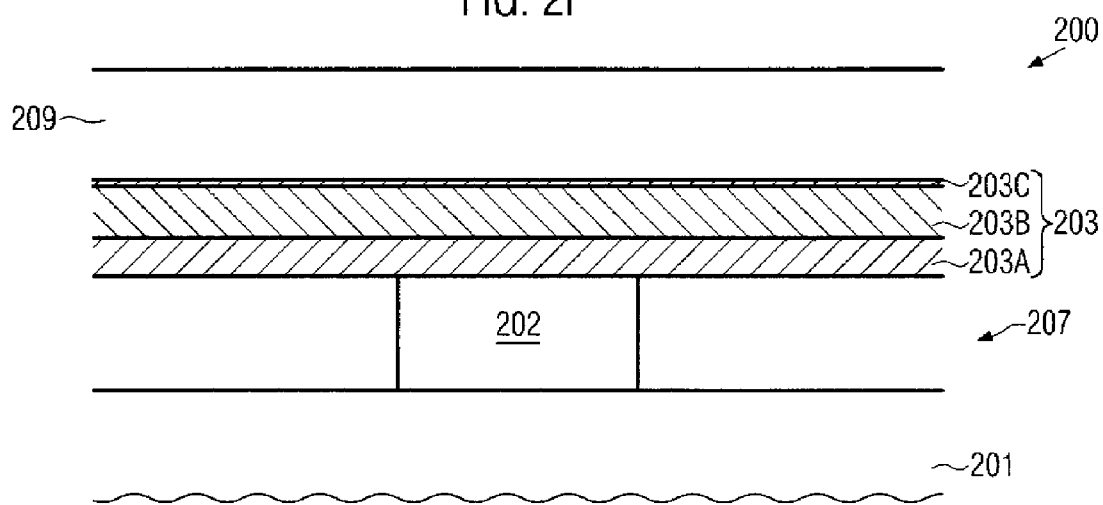

FIG. 2*g* schematically illustrates the semiconductor device 200 after the modification process 211. Hence, the passivation layer 203 may comprise a corresponding surface portion 203C having the respective surface characteristics according to a predefined target range as previously described. Furthermore, the dielectric cover layer 209, which may represent a polyimide layer and the like, may be formed on the passivation layer 203, wherein the surface conditions of the layer 203 may provide the desired adhesion and other characteristics in accordance with a predefined process sequence. Thereafter, the further processing may be continued as is previously described.

As a result, the subject matter disclosed herein provides a process technique for forming a passivation layer having desired surface characteristics that are obtained on the basis of a process sequence using a terminal metal layer stack, such as an aluminum-based terminal metal, wherein, however, a corresponding deposition and patterning of the terminal metal layer stack may be omitted, thereby reducing process complexity and thus overall production cost, while nevertheless providing similar process conditions during the subsequent steps for providing the final passivating material and underbump metallization layers followed by the bump structure. Thus, the final passivating material, such as polyimide and the like, and the underbump metallization material may encounter similar surface characteristics. For this purpose, the surface characteristics of a process sequence including a terminal metal layer stack may be examined in order to identify one or more surface characteristics that may significantly influence the further process flow. Based on the respective measurement data, a corresponding "replacement" process strategy, without requiring the deposition and patterning of the terminal metal layer stack, may be determined in order to provide similar process conditions yet with a significantly reduced process complexity. For instance, in some illustrative embodiments, for a passivation layer stack including a silicon nitride material followed by a silicon oxynitride material, a significant nitrogen depletion has been identified as having a significant influence on the further processing for forming the bump structure. Consequently, in this case, a silicon dioxide like material layer may be formed as the last layer of the passivation layer stack so as to provide similar process and surface conditions. In other cases, appropriate measurement procedures may be used, for instance the measurement of contact angles, in order to obtain the required measurement data for adjusting the surface characteristics of the passivation layer stack. For instance, a surface modification, such as an oxidation of a silicon oxynitride material on the basis of a nitrogen oxide ambient, may be used in order to obtain the desired surface characteristics. In still other cases, based on the respective measurement data, efficient "replacement" surface modification processes may be identified in order to obtain the desired surface characteristics, irrespective of the conventional process sequence under consideration, in which typically a terminal metal layer stack and the corresponding deposition and patterning processes are included. Thus, the desired high reliability of conventional process strategies in forming bump structures may be obtained while nevertheless significantly reducing process complexity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   determining a first nitrogen content of a surface portion of a first passivation layer formed on a last metallization layer of a first semiconductor device formed above a first substrate, wherein said surface portion of said first passivation layer has been subjected to a patterning process to pattern an aluminum-based terminal metal layer stack formed thereon;
   determining a range for a target nitrogen content for a surface portion of a second passivation layer to be formed above a last metallization layer of a second semiconductor device formed above a second substrate, wherein said determined range for said target nitrogen content is based on said determined first nitrogen content;
   forming a second passivation layer having a second nitrogen content in at least a surface portion thereof above a last metallization layer of a second semiconductor device that does not comprise an aluminum-based terminal metal layer stack formed thereon, wherein said second semiconductor device is formed above a second substrate and said second nitrogen content is within said determined range for said target nitrogen content; and
   forming additional passivation layers above each of a plurality of additional second substrates wherein a nitrogen content of a surface portion of each of said additional passivation layers is within said determined range for said target nitrogen content.

2. The method of claim 1, wherein forming said second passivation layer above said last metallization layer of said second substrate comprises depositing a dielectric layer stack, said dielectric layer stack comprising a cap layer having said second nitrogen content.

3. The method of claim 1, wherein forming said second passivation layer above said second substrate comprises depositing a dielectric layer stack and modifying a surface portion thereof such that said surface portion of said second passivation layer has said second nitrogen content.

4. The method of claim 1, wherein forming said second passivation layer above said second substrate comprises forming a silicon nitride layer and a silicon, oxygen and nitrogen-containing layer, and wherein said second nitrogen content represents a nitrogen content of said silicon, oxygen and nitrogen-containing layer.

5. The method of claim 4, further comprising forming a silicon dioxide layer on said silicon, oxygen and nitrogen-containing layer.

6. The method of claim 4, further comprising performing a treatment for reducing said nitrogen content in said surface portion of said silicon, oxygen and nitrogen-containing layer.

7. The method of claim 6, wherein said treatment is performed in a nitrogen oxide containing atmosphere.

8. The method of claim 1, further comprising forming a further dielectric material on each of said passivation layers formed above each of said second substrates and forming an underbump metallization layer on each of said further dielectric materials.

9. A method, comprising:
   determining a concentration of nitrogen in a surface portion of a first passivation layer formed on a last metallization layer of a first semiconductor device after said first passivation layer has been subjected to a patterning process to pattern an aluminum-based metal layer stack formed thereon;
   forming a second passivation layer above a last metallization layer of a second semiconductor device that does not comprise an aluminum-based terminal metal layer stack formed thereon, said second passivation layer comprising at least silicon and nitrogen;
   reducing a concentration of nitrogen in a surface portion of said second passivation layer to a concentration range based on said determined concentration of nitrogen in said surface portion of said first passivation layer subjected to said patterning process;
   forming a dielectric cover layer on said second passivation layer; and
   forming an underbump metallization layer on said dielectric cover layer and exposed portions of said last metallization layer of said second semiconductor device.

10. The method of claim 9, wherein reducing a concentration of nitrogen in a surface portion of said second passivation layer comprises performing a treatment in an oxidizing ambient after depositing said second passivation layer.

11. The method of claim 10, wherein said oxidizing ambient is established using a nitrogen oxide precursor.

12. The method of claim 9, wherein reducing a concentration of nitrogen in a surface portion of said second passivation layer comprises:
   identifying a process recipe for patterning an aluminum-based metal layer stack in a specific process flow for forming said underbump metallization layer on material corresponding to material of said dielectric cover layer;
   exposing said second passivation layer to a reactive ambient established using said process recipe; and
   forming said underbump metallization layer according to said specific process flow.

13. The method of claim 9, wherein forming said second passivation layer comprises forming a silicon nitride layer and forming a silicon oxynitride layer on said silicon nitride layer.

14. The method of claim 9, wherein forming said second passivation layer comprises forming a silicon nitride layer as a last layer of said second passivation layer and performing an oxidation process in a plasma ambient.

15. The method of claim 9, further comprising:
   forming additional passivation layers above a last metallization layer of a plurality of additional second semiconductor devices, each of said additional passivation layers comprising at least silicon and nitrogen;
   reducing a concentration of nitrogen in a surface portion of each of said additional passivation layers to a concentration range based on said determined concentration of nitrogen in said surface portion of said first passivation layer subjected to said patterning process;
   forming a dielectric cover layer on each of said additional passivation layers; and
   forming an underbump metallization layer on each of said dielectric cover layers and exposed portions of each of said last metallization layers.

* * * * *